United States Patent
Kamiya

(10) Patent No.: US 10,396,303 B2
(45) Date of Patent: Aug. 27, 2019

(54) ORGANIC ELECTROLUMINESCENCE DISPLAY DEVICE

(71) Applicant: Japan Display Inc., Minato-ku (JP)

(72) Inventor: Akinori Kamiya, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/933,607

(22) Filed: Mar. 23, 2018

(65) Prior Publication Data

US 2018/0287086 A1  Oct. 4, 2018

(30) Foreign Application Priority Data

Apr. 4, 2017 (JP) .................................. 2017-074158

(51) Int. Cl.
| | | |
|---|---|---|
| H01L 51/50 | (2006.01) | |
| H01L 51/56 | (2006.01) | |
| H01L 51/52 | (2006.01) | |
| H05K 1/18 | (2006.01) | |

(52) U.S. Cl.
CPC ...... *H01L 51/5012* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/5246* (2013.01); *H01L 51/56* (2013.01); *H05K 1/189* (2013.01); *H05K 2201/10128* (2013.01)

(58) Field of Classification Search
CPC ............. H01L 51/5012; H01L 51/5092; H01L 51/5246; H01L 51/5221; H01L 51/5072; H01L 51/5056; H01L 51/56; H01L 51/5206; H05K 2201/10128; H05K 1/189

USPC .......................................................... 257/40
See application file for complete search history.

(56) References Cited

U.S. PATENT DOCUMENTS

| | | | |
|---|---|---|---|
| 2014/0264300 A1 | 9/2014 | Kamiya | |
| 2015/0144889 A1* | 5/2015 | An ......................... | G01T 1/2018 257/40 |
| 2017/0069808 A1* | 3/2017 | Kim ..................... | H01L 27/1248 |

FOREIGN PATENT DOCUMENTS

| | | |
|---|---|---|
| JP | 2007-273274 | 10/2007 |
| JP | 4303591 | 7/2009 |
| JP | 2014-179278 | 9/2014 |
| WO | WO 03/028903 A2 | 4/2003 |

* cited by examiner

*Primary Examiner* — Karen Kusumakar
*Assistant Examiner* — Adam S Bowen
(74) *Attorney, Agent, or Firm* — Oblon, McClelland, Maier & Neustadt, L.L.P.

(57) ABSTRACT

An organic electroluminescence display device comprising a plurality of light emitting elements, a sealing film covering the plurality of light emitting elements, and having a top surface which is an inorganic film made of a first inorganic material, a protective film made of an organic material, the protective film covering the sealing film, and a close-fitting layer made of a second inorganic material and located between the top surface of the sealing film and the protective film. The first inorganic material has higher moisture-barrier properties than the second inorganic material, and adhesion between the second inorganic material and the organic material is higher than adhesion between the first inorganic material and the organic material.

9 Claims, 6 Drawing Sheets

ORGANIC ELECTROLUMINESCENCE DISPLAY DEVICE

CROSS-REFERENCE TO RELATED APPLICATION

The present application claims priority from Japanese application JP2017-074158 filed on Apr. 4, 2017, the content of which is hereby incorporated by reference into this application.

BACKGROUND OF THE INVENTION

1. Field of the Invention

This relates to organic electroluminescence display devices.

2. Description of the Related Art

An organic electroluminescence layer is vulnerable to moisture, necessitating being covered with a sealing film to be kept from atmosphere (JP4303591B, JP2007-273274A, and JP2014-179278A). The sealing film has at least its top surface made from inorganic material with high barrier properties.

On the sealing film may be disposed a protective film. The protective film is an etching mask used for patterning the sealing film in a manufacturing process. The protective film is made of an organic material. The inorganic material to constitute the top surface of the sealing film is selected in terms of barrier properties, arising a problem of poor fitting properties, that is to say, poor adhesion to the organic material provided thereon. Choice of an inorganic material with relatively high fitting properties, that is to say, high adhesion to the organic material results in low barrier properties.

SUMMARY OF THE INVENTION

This aims to secure barrier properties in a sealing film and to attain a close fit to an organic material provided over the sealing film.

An organic electroluminescence display device of the invention comprising: a plurality of light emitting elements; a sealing film covering the plurality of light emitting elements, and having a top surface which is an inorganic film made of a first inorganic material; a protective film made of an organic material, the protective film covering the sealing film; and a close-fitting layer made of a second inorganic material and located between the top surface of the sealing film and the protective film, wherein the first inorganic material has higher moisture-barrier properties than the second inorganic material, and adhesion between the second inorganic material and the organic material is higher than adhesion between the first inorganic material and the organic material.

The first inorganic material may secure barrier properties and the second inorganic material may secure a close fit to the organic material.

An organic electroluminescence display device of the invention comprising: a plurality of light emitting elements; an inorganic film above the plurality of light emitting elements, the inorganic film covering the plurality of light emitting elements; an amorphous silicon layer on the inorganic film; and an organic film on the amorphous silicon layer, the organic film covering the plurality of light emitting elements.

DETAILED DESCRIPTION OF THE INVENTION

Figure 1:
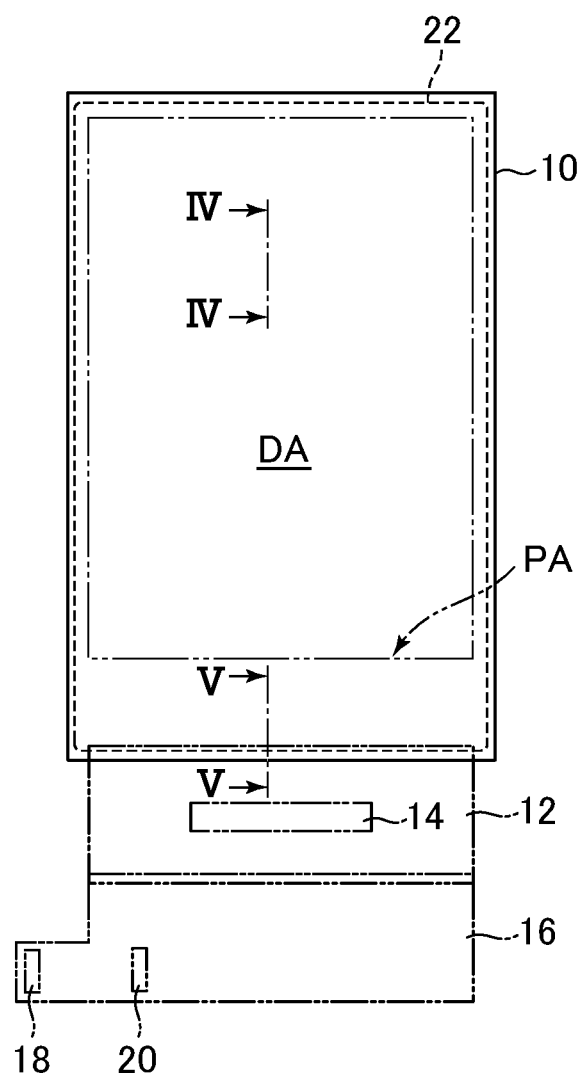
FIG. 1 is a plan view of a display device in accordance with an embodiment.

Hereinafter, an embodiment will be described with reference to the drawings. Here, the invention can be embodied according to various aspects within the scope of the invention without departing from the gist of the invention and is not construed as being limited to content described in the embodiment exemplified below.

The drawings are further schematically illustrated in widths, thickness, shapes, and the like of units than actual forms to further clarify description in some cases, but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

Figure 2:
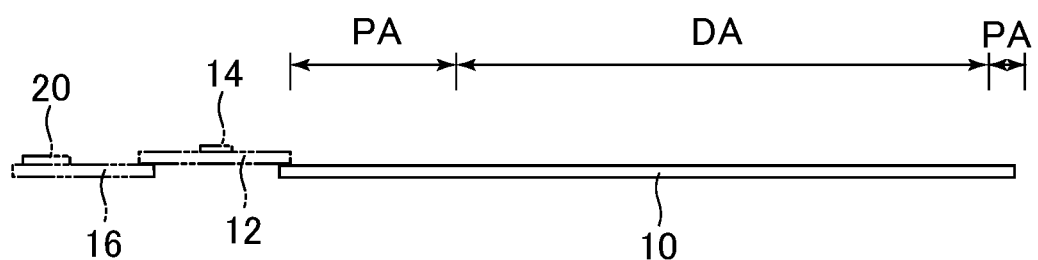
FIG. 2 is a side view of a display device in accordance with an embodiment.

FIG. 1 is a plan view of a display device in accordance with an embodiment. FIG. 2 is a side view of a display device in accordance with an embodiment. The display device is an organic electroluminescence display device. The display device is configured to display a full-color image in full-color pixels, each of which consists of combination of unit pixels (subpixels) of colors such as red, green, and blue. The display device includes a substrate 10. The substrate 10 includes a display area DA and a peripheral area PA around the display area DA. The substrate 10 in the peripheral area PA may be connected to a first flexible printed circuit board 12. The first flexible printed circuit board 12 has an integrated circuit chip 14 mounted thereon for driving an element to display the image. The first flexible printed circuit board 12 may be connected to a second flexible printed circuit board 16. The second flexible printed circuit board 16 has a connector 18 attached thereto for external electrical connection.

Figure 3:
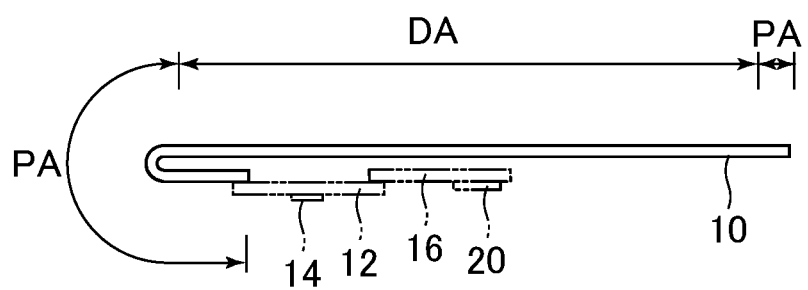
FIG. 3 is a diagram to show usage of the display device in FIG. 2.

FIG. 3 is a diagram to show usage of the display device in FIG. 2. The display device may contain the substrate 10 curved in a housing unillustrated. The display device has the peripheral area PA curved although the display area DA is kept flat.

Figure 4:
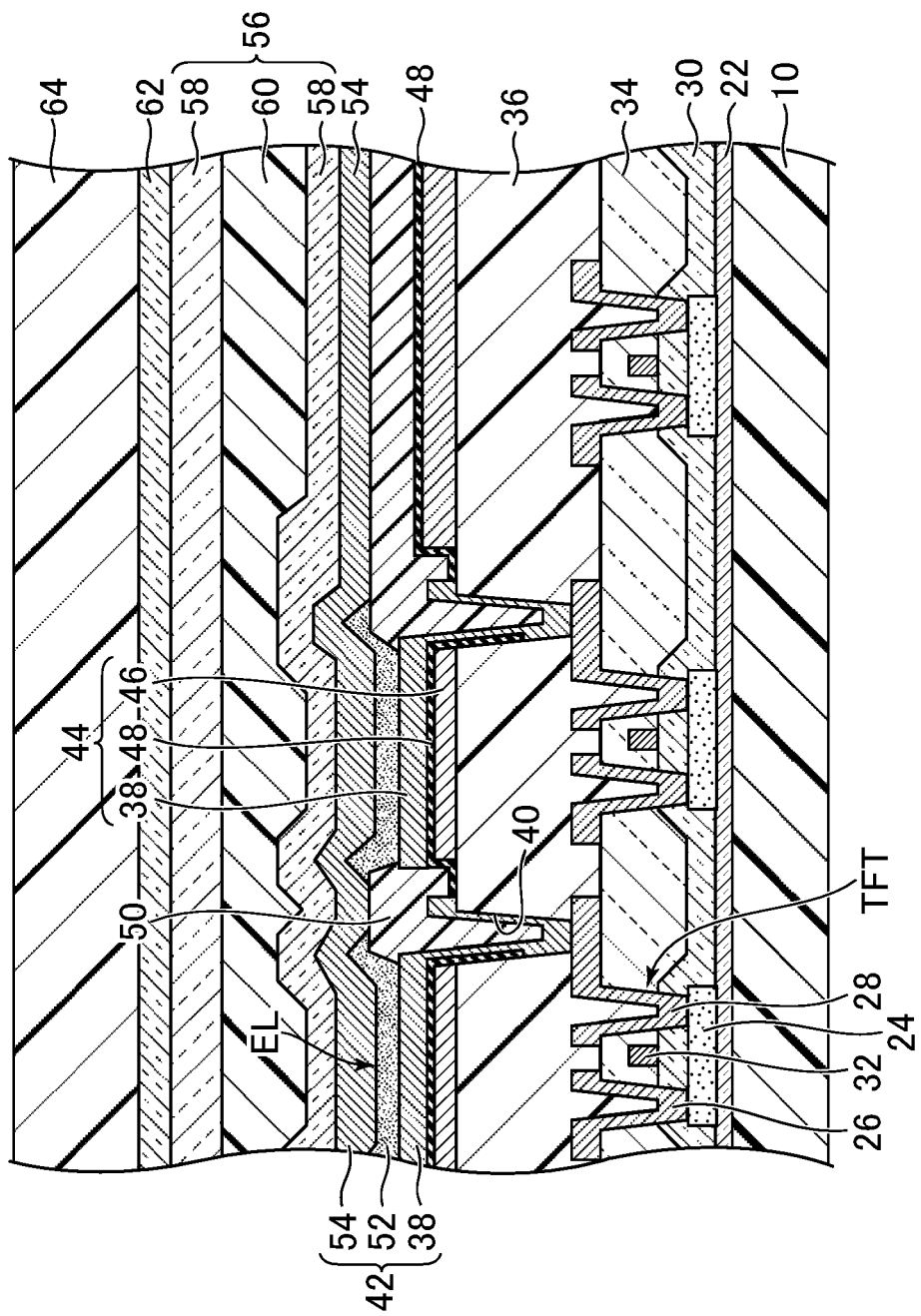
FIG. 4 is a IV-IV line cross-sectional view on larger scale of the display device in FIG. 1 with some portions omitted.

FIG. 4 is a IV-IV line cross-sectional view on larger scale of the display device in FIG. 1 with some portions omitted. The substrate 10 may be made of polyimide resin or polyethylene terephthalate, having flexibility in a thickness of 10-20 μm. The substrate 10 has an underlying insulating film 22 formed thereon for a barrier against impurities contained therein. The underlying insulating film 22 may be a silicone oxide film or a silicon nitride film and further may have a laminate structure of these. For example, a silicon nitride film, a silicone oxide film, and a silicon nitride film, which constitute a three-layer structure, may have thicknesses of 20-50 nm, 20-50 nm, and 100-500 nm, respectively.

On the underlying insulating film 22 is formed a semiconductor layer 24. The semiconductor layer 24 may be a polysilicon layer, formed from an amorphous silicon layer subject to excimer-laser annealing, in a thickness of 50 nm. A source electrode 26 and a drain electrode 28 are electrically connected to the semiconductor layer 24; a gate insulating layer 30 covers the semiconductor layer 24. The gate insulating layer 30 may have a thickness of 80-100 nm and may be formed from compound, Tetraethoxysilane (TEOS), whose chemical formula is $Si(OC_2H_5)_4$. The source electrode 26 or the drain electrode 28 may have a laminate structure consisting of Mo, AlNd, and Mo, or another laminate structure consisting of Ti, Al, and Ti. Its three layers may have a thickness of 100-200 nm, 300-600 nm, and 30-100 nm, respectively.

On the gate insulating layer 30 sits a gate electrode 32, which is covered with an interlayer dielectric 34. The source electrode 26 and the drain electrode 28 penetrate the gate insulating layer 30. The source electrode 26 and the drain electrode 28 in the display area DA are just on the interlayer dielectric 34 and penetrate the interlayer dielectric 34. The semiconductor layer 24, the source electrode 26, the drain electrode 28, the gate electrode 32, and gate insulating layer 30 constitute at least part of a thin film transistor TFT. The thin film transistor TFT is in the display area DA. In the display area DA, the gate electrode 32 is just on the gate insulating layer 30. A planarization layer 36 is formed to cover the thin film transistor TFT. The planarization layer 36 is formed from an organic material such as polyimide resin or photosensitive acrylic resin, in a thickness of 2-3 μm.

On the planarization layer 36, a plurality of pixel electrodes 38 (e.g. anode) are formed and configured to correspond to respective unit pixels (the subpixels). The pixel electrode 38 includes films of indium tin oxide (ITO), Ag, and ITO in thicknesses of 30-60 nm, 10-150 nm, and 10-20 nm, respectively, in a laminate structure of an electrode film and a light reflective film. Or, the pixel electrode 38 may include laminated films of indium zinc oxide (IZO), Ag, and IZO, in the above thicknesses. The pixel electrode 38 is electrically connected to one of the source electrode 26 and the drain electrode 28 through a contact hole 40 penetrating the planarization layer 36, above the interlayer dielectric 34.

The pixel electrode 38, which constitutes part of a light emitting element 42 as described hereinafter, is an electrode of a capacitor 44 as well. The capacitor 44 includes the pixel electrode 38, a capacity electrode 46 below it, and a dielectric insulating film 48 between the pixel electrode 38 and the capacity electrode 46. The dielectric insulating film is a laminated layer of a silicon nitride film and a silicone oxide film or a silicon nitride film, having a thickness of 200 nm or less. The capacity electrode 46 may have a three-layer structure formed from Mo, AlNd, and Mo or Ti, Al, and Ti, in a thickness of 200 nm or less. The capacitor 44 holds a signal to control a current to be supplied to the pixel electrode 38.

On the pixel electrode 38 may be formed an insulating layer 50, from polyimide resin or acrylic resin, in a thickness of 1-2 μm. The insulating layer 50 is formed to sit on an edge portion of the pixel electrode 38 and to have an opening to expose a portion (e.g. central portion) of the pixel electrode 38. The insulating layer 50 constitutes a bank around the portion of the pixel electrode 38.

On the pixel electrode 38 is disposed a light emitting layer 52. The light emitting layers 52 are disposed (separately) on the respective pixel electrodes 38, sitting on the insulating layer 50 as well. In this case, the light emitting layer 52 emits light in blue, red, or green in accordance with the corresponding pixel. The color in accordance with each pixel is not limited thereto and may be yellow or white. The light emitting layer 52 may be formed by vapor deposition or may be formed to entirely cover the display area DA (see FIG. 1) over the plurality of pixels. The light emitting layer 52 may be formed to be continuous over the insulating layer 50. In this case, the light emitting layer 52 is formed by a coating method using solvent dispersion. The light emitting layer 52 over the plurality of pixels is configured to emit white light at every subpixel, extracting intended color wavelengths through a color filter unillustrated.

On the light emitting layer 52 is disposed a counter electrode 54 (common electrode or cathode). The counter electrode 54 sits on the insulating layer 50 for a bank. The light emitting layer 52, and the pixel electrode 38 and the counter electrode 54 interposing the light emitting layer 52 therebetween constitute at least part of the light emitting element 42. The light emitting layer 52 is between the pixel electrode 38 and the counter electrode 54 to emit light, with brightness controlled by a current flowing therebetween. The plurality of light emitting elements 42 are arranged in the display area DA and driven by a plurality of thin film transistors TFT. A capacitor 44 is provided to correspond to each of the light emitting elements 42.

Between the light emitting layer 52 and the pixel electrode 38 may be disposed at least one layer of a hole transport layer and a hole injection layer, unillustrated. Between the light emitting layer 52 and the counter electrode 54 may be disposed at least one layer of an electron transport layer and an electron injection layer, unillustrated. At least one layer or each layer of the hole transport layer, the hole injection layer, the electron transport layer, and the electron injection layer may be isolated for the corresponding pixel electrode 38, or may be formed to be continuous all over the display area. The light emitting layer 52, with the hole transport layer, the hole injection layer, the electron transport layer, and the electron injection layer, if necessary, constitutes an organic electroluminescence layer EL.

The organic electroluminescence layer EL is blocked from moisture by being sealed with a sealing film 56. The plurality of light emitting elements 42 are sealed with the sealing film 56. The sealing film 56 includes an inorganic film 58 to form at least its top surface. The inorganic film 58 is formed from a first inorganic material. The first inorganic material is silicon nitride.

The sealing film 56 consists of some layers including an organic layer 60 at a center in a thickness direction. In FIG. 4 the sealing film 56 has a structure where at least one organic layer 60, which may be formed from resin, is interposed between a pair of inorganic films 58. Each inorganic film 58 may have a thickness of 1-10 μm. The organic layer 60 may have a thickness of 5-50 μm. The sealing film 56 covers the display area DA (see FIG. 1).

On the sealing film 56 is disposed a protective film 64 with a close-fitting layer 62 interposed therebetween. The protective film 64 is made of an organic material. The protective film 64 covers the sealing film 56. The close-fitting layer 62 is in close contact between the top surface of the sealing film 56 and the protective film 64. The close-fitting layer 62 is made of a second inorganic material. The second inorganic material is selected from a group consisting of amorphous silicon, silicon oxide, and silicon oxynitride. The second inorganic material (close-fitting layer 62) has a closer fit to the organic material (protective film 64) than the first inorganic material (inorganic film 58). In other words, adhesion between the second inorganic material and the organic material is higher than adhesion between the first inorganic material and the organic material. The first inorganic material (inorganic film 58) has higher barrier properties than the second inorganic material (close-fitting layer 62).

According to the embodiment, the first inorganic material (inorganic film 58) can secure barrier properties and the second inorganic material (close-fitting layer 62) can secure a close fit to the organic material (protective film 64).

Figure 5:
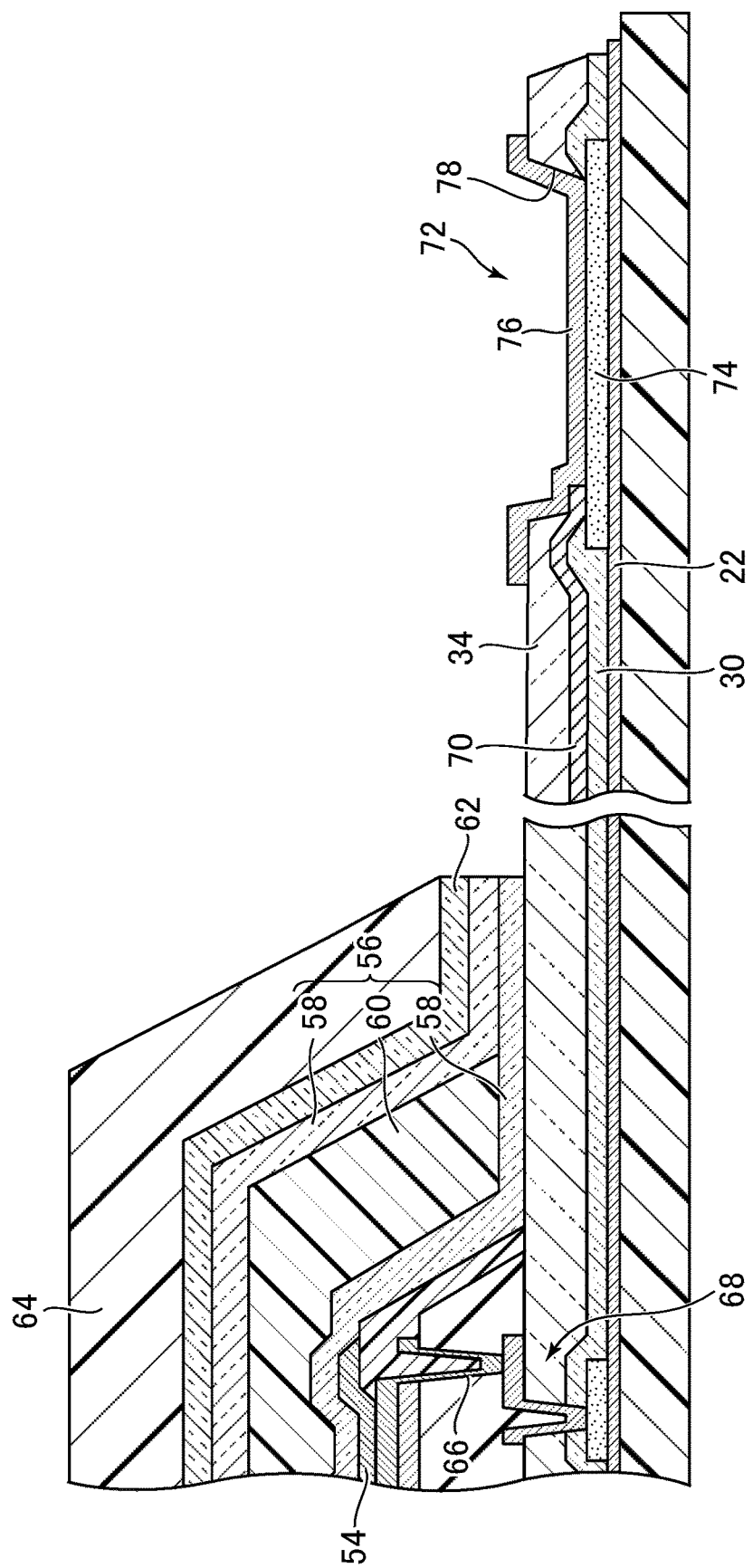
FIG. 5 is a V-V line cross-sectional view on larger scale of the display device in FIG. 1 with some portions omitted.

FIG. 5 is a V-V line cross-sectional view on larger scale of the display device in FIG. 1 with some portions omitted. The counter electrode 54 is connected to a peripheral circuit 68 through a cathode contact 66 in the peripheral area PA. The pair of inorganic films 58 of the sealing film 56, which protrude from the organic layer 60 between them, are vertically in contact with each other around the organic layer 60, in the peripheral area PA. The protective film 64, the sealing film 56 (pair of inorganic film 58), and the close-fitting layer 62 have respective peripheries matched with one another.

On the substrate 10 are laminated some layers in the peripheral area PA. The layers include some interconnect lines 70. The interconnect line 70 may have a laminate structure of Ti, Al, and Ti, or may be formed from MoW. The interconnect line 70 may have the laminate structure of Ti, Al, and Ti in their thicknesses of 100-200 nm, 100-300 nm, and 100-200 nm, respectively. The interconnect lines 70 may include a signal line, a scan line, power line, and a ground line.

The interconnect lines 70 each extend toward terminals 72. The terminals 72 are connected to the first flexible printed circuit board 12 shown in FIG. 1. The terminal 72 includes a semiconductor film 74. The semiconductor film 74 is in a layer where lies the semiconductor layer 24 of the thin film transistor TFT as shown in FIG. 4, by being simultaneously formed from same materials. The terminal 72 includes an electrode film 76. The electrode film 76 is in a layer where lie the source electrode 26 and the drain electrode 28, by being simultaneously formed from same materials. The semiconductor film 74 and the electrode film 76 are laminated.

The underlying insulating film 22, under the semiconductor layer 24 in the display area DA in FIG. 4, extends to the peripheral area PA in FIG. 5 and under the semiconductor film 74. The interlayer dielectric 34 in the display area DA extends to the peripheral area PA and has an opening 78 on the semiconductor film 74 in at least a central portion of the semiconductor film 74. The electrode film 76 sits on and is in contact with the semiconductor film 74 in the opening 78 of the interlayer dielectric 34; the electrode film 76 sits on and is in contact with the interlayer dielectric 34 around the opening 78.

The gate insulating layer 30 in FIG. 4 extends to the peripheral area PA, as shown in FIG. 5. The interconnect lines 70 are just on the gate insulating layer 30 in the peripheral area PA. The interconnect line 70 is in a layer where lies the gate electrode 32, by being simultaneously formed from same materials.

Figure 6:
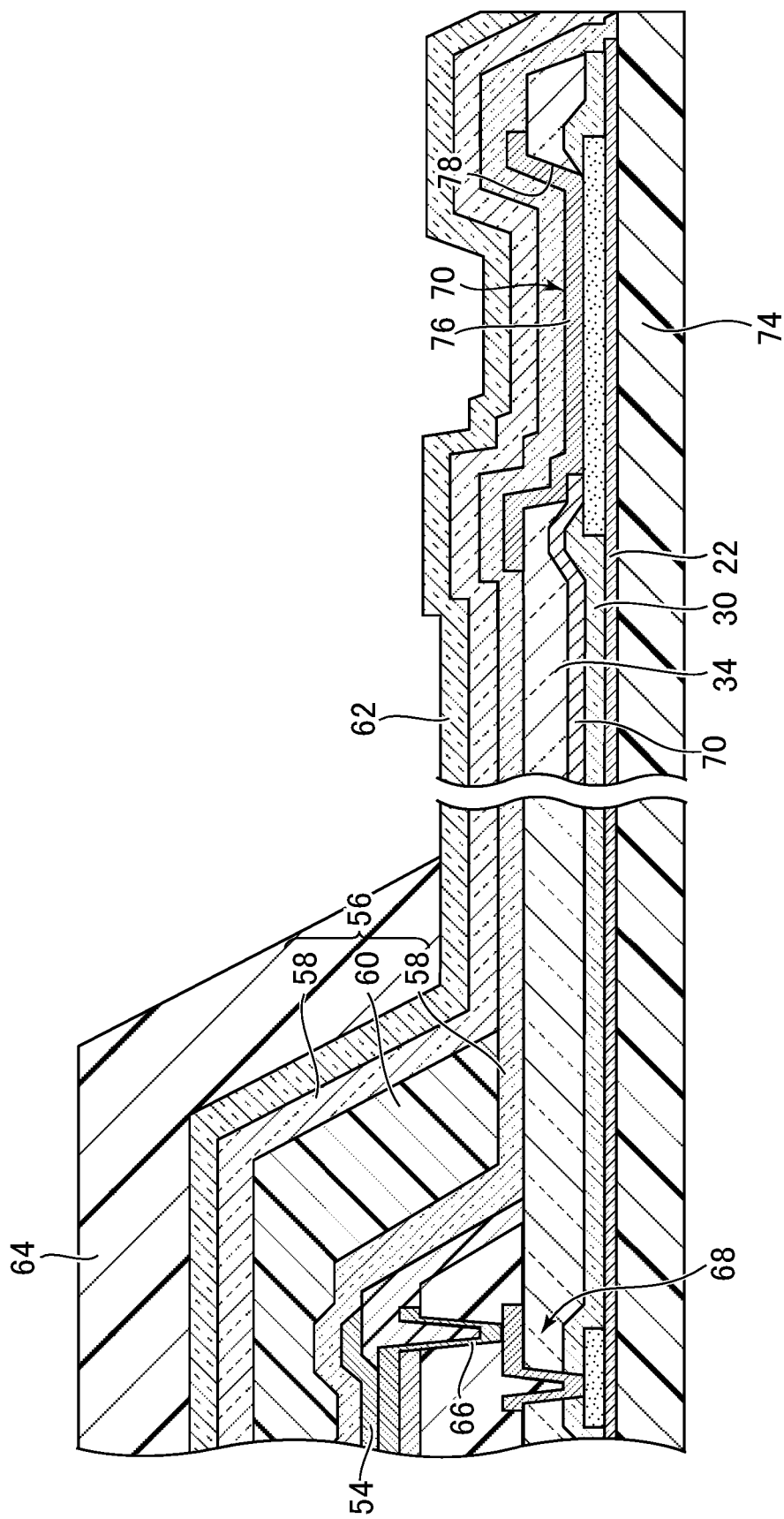
FIG. 6 is a diagram to explain a manufacturing method of the display device in accordance with the embodiment.

FIG. 6 is a diagram to explain a manufacturing method of the display device in accordance with the embodiment. The embodiment includes forming the sealing film 56 so as to cover the terminals 72. Specifically, the pair of inorganic film 58 of the sealing film 56 are overlaid on the terminals 72. Thus, the organic electroluminescence layer EL in FIG. 4 is sealed with the sealing film 56. The sealing film 56, at least its top surface, is formed from the first inorganic material. At least the top surface of the sealing film 56 is made of the inorganic film 58.

The close-fitting layer 62 is formed from the second inorganic material so as to be in close contact with the top surface (inorganic film 58) of the sealing film 56. As shown in FIG. 6, the close-fitting layer 62 is also formed to cover the terminals 72. The second inorganic material (close-fitting layer 62) has the closer fit to the organic material (protective film 64) than the first inorganic material (inorganic film 58), whereas the first inorganic material (inorganic film 58) has higher barrier properties than the second inorganic material (close-fitting layer 62).

The protective film 64 is formed from organic material to cover a part of the close-fitting layer 62 and a part of the sealing film 56. The protective film 64 is patterned to be left except on the terminals 72, using photolithography. The protective film 64 is patterned to be left except on the curve area of the substrate 10 as well, as shown in FIG. 3.

The close-fitting layer 62 and the sealing film 56 are etched using the protective film 64 as an etching mask. By the etching, the terminals 72 are exposed from the sealing film 56 and from the close-fitting layer 62 as well. The protective film 64 may be removed afterward but shall be left in a product in the embodiment. Thus, the display device in FIG. 5 is obtained.

According to the embodiment, the first inorganic material (inorganic film 58) can secure barrier properties and the second inorganic material (close-fitting layer 62) can secure a close fit to the organic material (protective film 64).

While there have been described what are at present considered to be certain embodiments, it will be understood that various modifications may be made thereto, and it is intended that the appended claims cover all such modifications as fall within the true spirit and scope of the invention.

What is claimed is:

1. An organic electroluminescence display device, comprising:
   a plurality of light emitting elements;
   a sealing film covering the plurality of light emitting elements, and having a top surface which is an inorganic film made of a first inorganic material;
   a protective film made of an organic material, the protective film covering the sealing film; and
   a close-fitting layer made of a second inorganic material, and located between the top surface of the sealing film and the protective film,
   wherein
   the first inorganic material has higher moisture-barrier properties than the second inorganic material,
   adhesion between the second inorganic material and the organic material is higher than adhesion between the first inorganic material and the organic material,
   an edge portion of the inorganic film overlaps with an edge portion of the close-fitting layer in a plan view,
   the edge portion of the close-fitting layer overlaps with an edge portion of the protective film in the plan view, the sealing film includes an organic film under the inorganic film and a second inorganic film under the organic film, the edge portion of the inorganic film is in direct contact with an edge portion of the second inorganic film, and the edge portion of the close-fitting layer overlaps with the edge portion of the second inorganic film, in the plan view.

2. The organic electroluminescence display device according to claim 1, wherein the first inorganic material is silicon nitride.

3. The organic electroluminescence display device according to claim 1, wherein the second inorganic material is amorphous silicon.

4. The organic electroluminescence display device according to claim 1, wherein the second inorganic material is silicon oxide or silicon oxynitride.

5. An organic electroluminescence display device, comprising:

a plurality of light emitting elements;

an inorganic film above the plurality of light emitting elements, the inorganic film covering the plurality of light emitting elements;

an amorphous silicon layer on the inorganic film;

an organic film on the amorphous silicon layer, the organic film covering the plurality of light emitting elements, a display area in which the plurality of light emitting elements are arranged; and a peripheral area outside the display area, the peripheral area including terminals, wherein the inorganic film has an edge portion in the peripheral area and the amorphous silicon layer has an edge portion in the peripheral area, and the edge portion of the inorganic film overlaps with the edge portion of the amorphous silicon layer, in a plan view.

6. The organic electroluminescence display device according to claim 5, wherein the inorganic film includes silicon nitride.

7. The organic electroluminescence display device according to claim 5, wherein the organic film has an edge portion in the peripheral area, and the edge portion of the amorphous silicon layer overlaps with the edge portion of the organic film in a plan view.

8. The organic electroluminescence display device according to claim 7, further comprising:

a second inorganic film on a side of the plurality of light emitting elements, the inorganic film being located above the side; and a second organic film between the inorganic film and the second inorganic film, wherein the inorganic film is in direct contact with the second inorganic film in the peripheral area, and the edge portion of the amorphous silicon layer overlaps with an edge of the second inorganic film in the plan view.

9. The organic electroluminescence display device according to claim 7, wherein the peripheral area includes a curve area, and the edge portion of the organic film is between the display area and the curve area.

* * * * *